US012058822B2

(12) United States Patent
Nakamura et al.

(10) Patent No.: US 12,058,822 B2
(45) Date of Patent: Aug. 6, 2024

(54) ELECTRONIC CONTROL DEVICE

(71) Applicant: HITACHI ASTEMO, LTD., Hitachinaka (JP)

(72) Inventors: Yuki Nakamura, Tokyo (JP); Masahiro Toyama, Tokyo (JP); Hiroki Funato, Tokyo (JP); Hideyuki Sakamoto, Hitachinaka (JP); Shinya Kawakita, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 228 days.

(21) Appl. No.: 17/787,852

(22) PCT Filed: Nov. 24, 2020

(86) PCT No.: PCT/JP2020/043703
§ 371 (c)(1),
(2) Date: Jun. 21, 2022

(87) PCT Pub. No.: WO2021/131462
PCT Pub. Date: Jul. 1, 2021

(65) Prior Publication Data
US 2023/0031292 A1    Feb. 2, 2023

(30) Foreign Application Priority Data
Dec. 23, 2019  (JP) ................. 2019-231755

(51) Int. Cl.
*H05K 5/00* (2006.01)
*H01L 23/66* (2006.01)
(Continued)

(52) U.S. Cl.
CPC .......... *H05K 5/0047* (2013.01); *H01L 23/66* (2013.01); *H05K 1/025* (2013.01); *H05K 5/0073* (2013.01); *H05K 9/0009* (2013.01)

(58) Field of Classification Search
CPC .. H05K 5/0047; H05K 5/0073; H05K 5/0069; H05K 9/0018; H05K 9/0009; H01L 23/66; H02G 3/08
See application file for complete search history.

(56) References Cited

U.S. PATENT DOCUMENTS 6,016,083 A * 1/2000 Satoh ................... H05K 9/0018
                                                          333/182
6,249,062 B1 * 6/2001 Suzuki ................. H05K 9/0018
                                                          307/89
(Continued)

FOREIGN PATENT DOCUMENTS

JP    2001-223489 A    8/2001
JP    2019-106404 A    6/2019

OTHER PUBLICATIONS

International Search Report with English Translation and Written Opinion for International Application No. PCT/JP2020/043703 dated Feb. 16, 2021.

*Primary Examiner* — Timothy J Thompson
*Assistant Examiner* — Amol H Patel
(74) *Attorney, Agent, or Firm* — Foley & Lardner LLP

(57) ABSTRACT

An electronic control device including a circuit substrate having a signal wiring and a ground wiring; at least one connector having a signal conductor and a ground conductor respectively connected to the signal wiring and the ground wiring of the circuit substrate on one end side and extending on the other end side; a housing including an accommodating portion that accommodates the circuit substrate and the at least one connector, in which a radio wave path through which a leakage electromagnetic wave propagates from one end on the circuit substrate side toward the other end on the side opposite to the circuit substrate side of the at least one connector is formed in an internal space at the periphery of the at least one connector; and a leakage electromagnetic (Continued)

wave attenuating structure provided between the housing and the at least one connector; where the leakage electromagnetic wave attenuating structure includes a plurality of conductors that are arrayed along a direction in which the leakage electromagnetic wave propagates from the one end of the at least one connector, and attenuate the leakage electromagnetic wave propagating through the radio wave path.

14 Claims, 22 Drawing Sheets

(51) Int. Cl.
    *H02G 3/08*         (2006.01)
    *H05K 1/02*         (2006.01)
    *H05K 9/00*         (2006.01)

(56) References Cited

U.S. PATENT DOCUMENTS

| | | | |
|---|---|---|---|
| 6,344,978 B1* | 2/2002 | Komiya | H05K 9/0018 |
| | | | 174/382 |
| 10,219,394 B1* | 2/2019 | Bantiles | H05K 5/006 |
| 2003/0080836 A1* | 5/2003 | Nagaishi | H01Q 21/0087 |
| | | | 257/E23.114 |
| 2015/0233980 A1* | 8/2015 | Umetsu | H01R 13/6683 |
| | | | 439/620.22 |
| 2021/0185795 A1* | 6/2021 | Toyama | H05K 7/20854 |

* cited by examiner

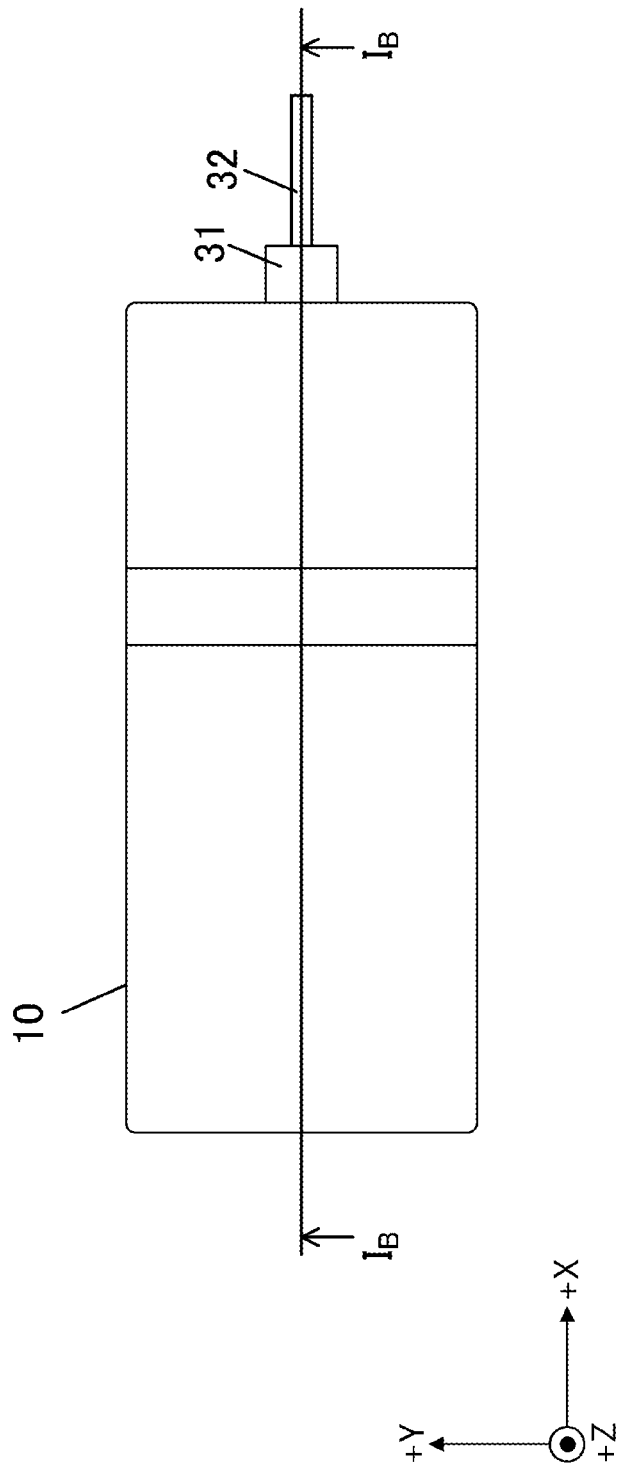

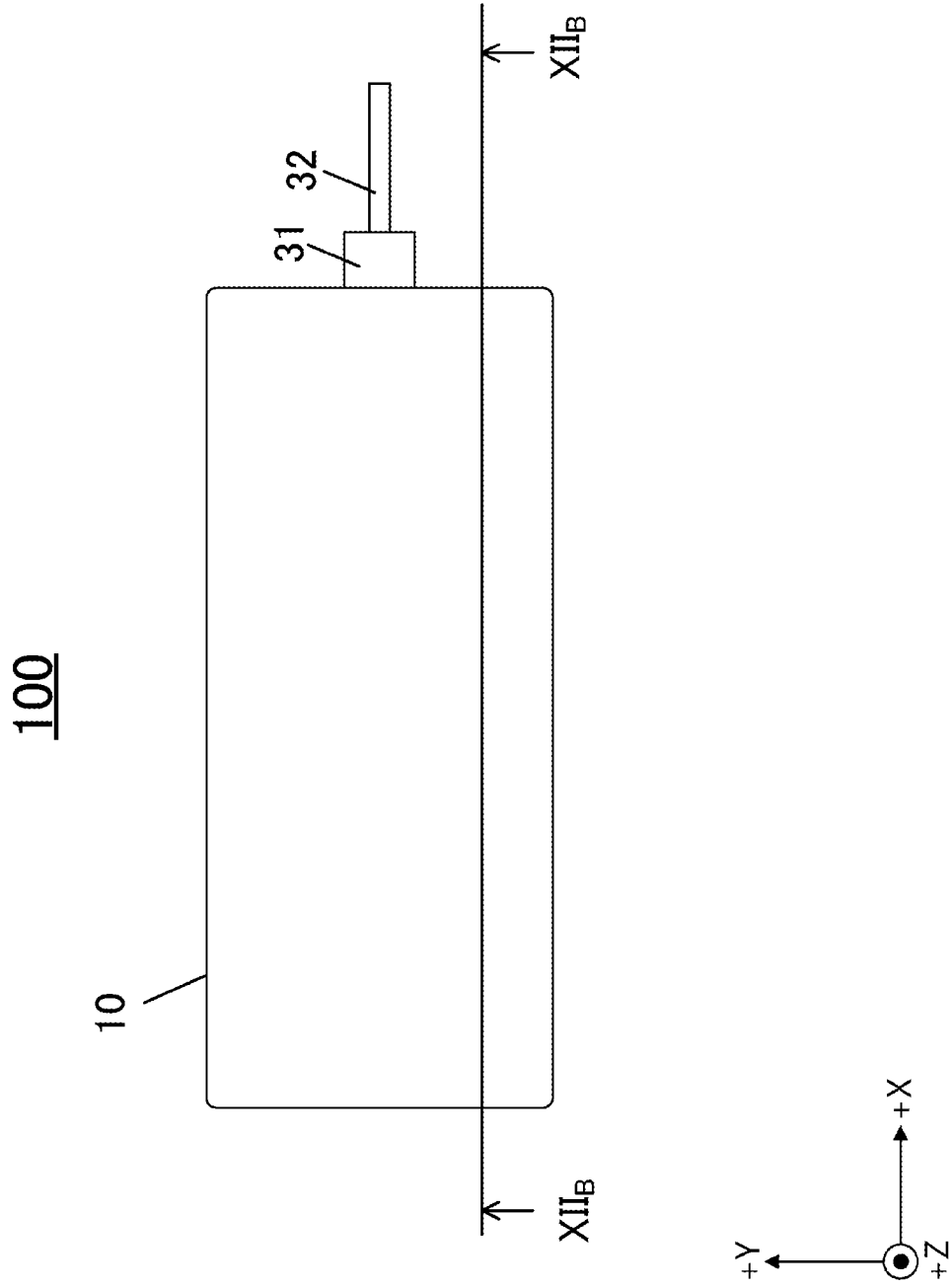

ELECTRONIC CONTROL DEVICE

TECHNICAL FIELD

The present invention relates to an electronic control device.

BACKGROUND ART

An electronic control device used in an electronic control device for a vehicle or the like has been reduced in size and improved in performance, and in recent years, a high-speed communication technology at a Gbps level is being studied.

As an electronic control device having a high-speed switching semiconductor element, a structure in which a circuit substrate unit including a driving semiconductor element and a connector are accommodated in a shield case is used. As an example of such an electronic control device, a structure is known in which a shielding material having heat dissipation is provided on a circuit substrate, a driving semiconductor element is attached to the shielding material, and a connection pin of a connector attached to a bracket is exposed on the circuit substrate and soldered to the circuit substrate. In this structure, there is a description that a level of a noise signal induced in the connector can be lowered by an electromagnetic shield action between the electronic circuit unit and the connector (see, for example, PTL 1).

CITATION LIST

Patent Literature

PTL 1: JP 2001-223489 A

SUMMARY OF INVENTION

Technical Problem

In the structure formed of a conductor such as a shield case as described in PTL 1, an electromagnetic wave coupled between a signal line of a circuit substrate and a ground line leaks at a connecting portion between a circuit substrate and a connector, and the leakage electromagnetic wave is radiated to the outside of the electronic control device via the connector with a space between the shield case and the connector serving as a waveguide. The electronic control device described in PTL 1 cannot suppress a leakage electromagnetic wave propagating between the shield case and the connector and radiating from the connector.

Solution to Problem

An electronic control device according to one aspect of the present invention includes a circuit substrate having a signal wiring and a ground wiring; at least one connector having a signal conductor and a ground conductor respectively connected to the signal wiring and the ground wiring of the circuit substrate on one end side and extending on the other end side; a housing including an accommodating portion that accommodates the circuit substrate and the at least one connector, in which a radio wave path through which a leakage electromagnetic wave propagates from one end on the circuit substrate side toward the other end on the side opposite to the circuit substrate side of the at least one connector is formed in an internal space at the periphery of the at least one connector; and a leakage electromagnetic wave attenuating structure provided between the housing and the at least one connector; where the leakage electromagnetic wave attenuating structure includes a plurality of conductors that are arrayed along a direction in which the leakage electromagnetic wave propagates from the one end of the at least one connector, and attenuate the leakage electromagnetic wave propagating through the radio wave path.

Advantageous Effects of Invention

According to the present invention, it is possible to suppress the leakage electromagnetic wave propagating in a radio wave path between a housing and a connector.

BRIEF DESCRIPTION OF DRAWINGS

FIG. 1A shows a first embodiment of an electronic control device of the present invention and is a plan view as viewed from above.

FIG. 12A shows a fifth embodiment of the electronic control device of the present invention and is a plan view as viewed from above.

DESCRIPTION OF EMBODIMENTS

Figure 1B:
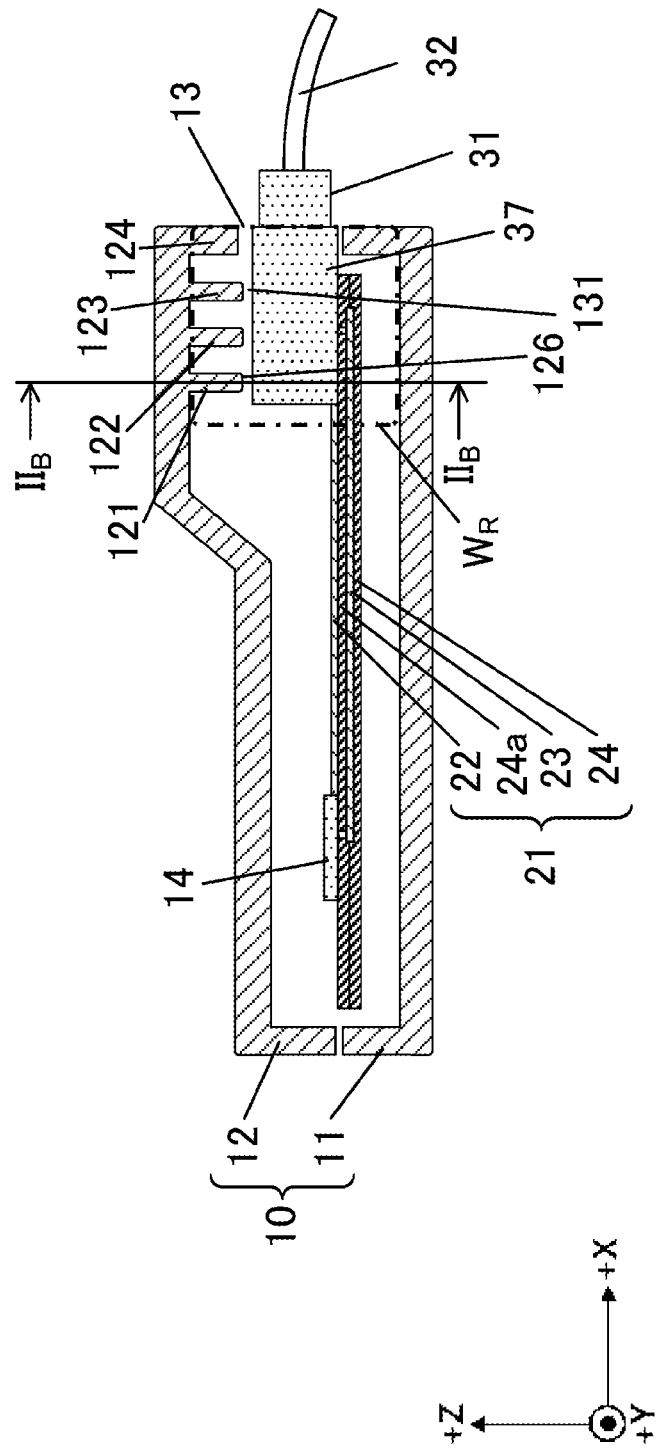
FIG. 1B is a cross-sectional view taken along line $I_B$-$I_B$ of FIG. 1A.

Hereinafter, embodiments of the present invention will be described with reference to the drawings. The following description and drawings are examples for describing the present invention, and are omitted and simplified as appropriate for the sake of clarity of description. The present invention can be implemented in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

In a case where there is a plurality of components having the same or similar functions, the description may be made with different subscripts given to the same reference numerals. However, in a case where it is not necessary to distinguish the plurality of components, the description may be made with the subscripts omitted.

First Embodiment

Hereinafter, a first embodiment of the present invention will be described with reference to FIGS. 1A to 3.

Figure 2A:
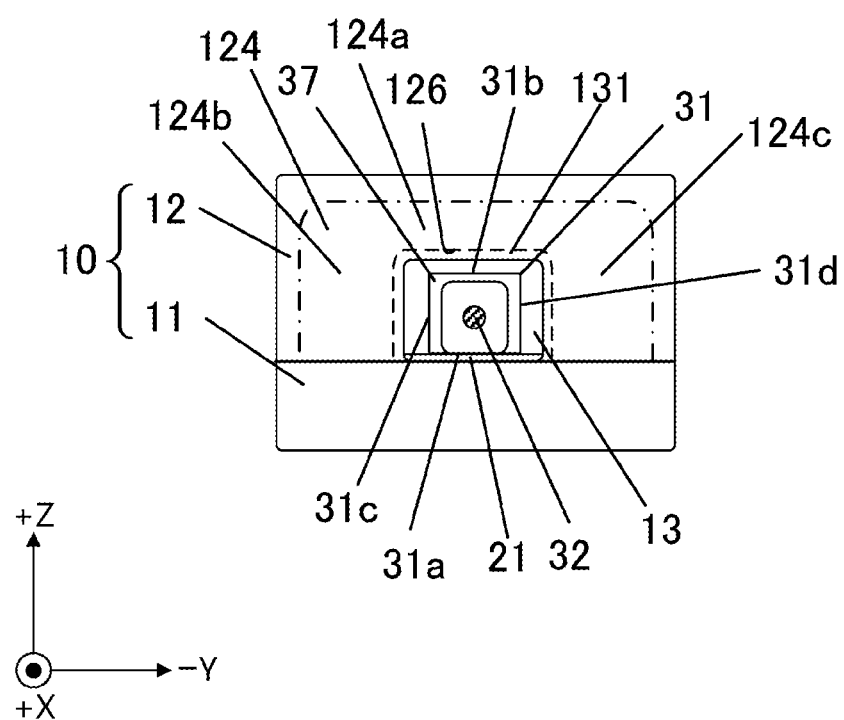
FIG. 2A is a side view of FIG. 1B as viewed from a connector side.
Figure 2B:
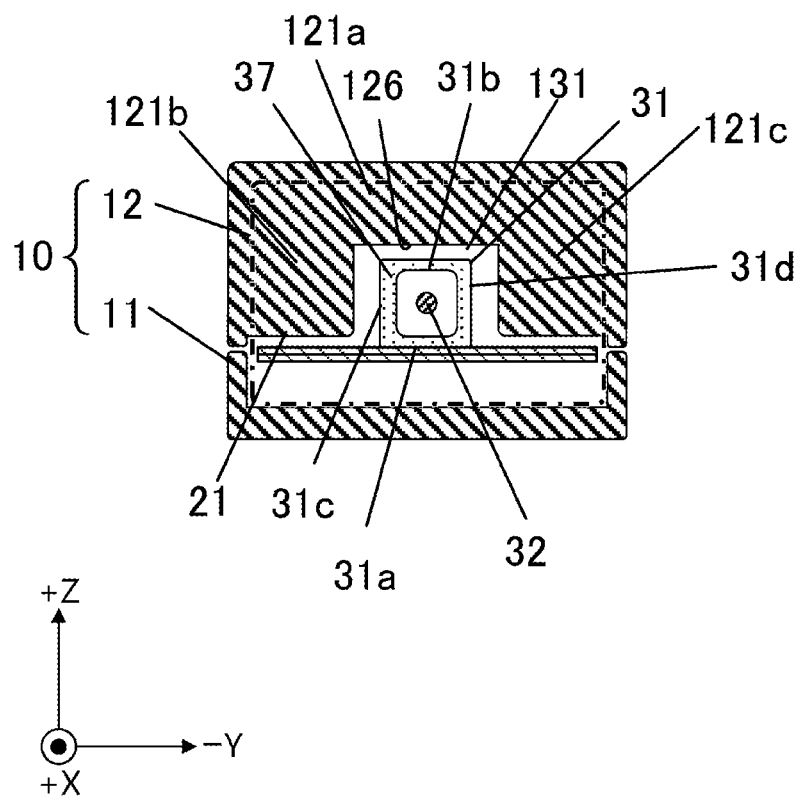
FIG. 2B is a cross-sectional view taken along line $I_B$-$I_B$ of FIG. 1B.

FIG. 1A shows a first embodiment of an electronic control device of the present invention, and is a plan view as viewed from above; FIG. 1B is a cross-sectional view taken along line $I_B$-$I_B$ of FIG. 1A, FIG. 2A is a side view as viewed from a connector side of FIG. 1B, and FIG. 2(B) is a cross-sectional view taken along line $II_B$-$II_B$ of FIG. 1B.

An electronic control device 100 includes a housing 10 formed by a first housing 11 and a second housing 12, a circuit substrate 21 accommodated in the housing 10, and a connector 31.

The first housing 11 is formed in a box shape having an opening formed on the upper side, and the second housing 12 is formed in a box shape having an opening on the lower side. As illustrated in FIG. 1B, the first housing 11 and the second housing 12 are fixed in a state of being stacked in the vertical direction (Z direction) with the respective opening peripheral edge portions abutted with each other. In the following description, the X direction, the Y direction, and the Z direction are directions illustrated in the drawings.

The first housing 11 and the second housing 12 are fixed by, for example, snap-fitting in which one of the first housing 11 and the second housing 12 is provided with an engagement piece and the other is provided with a locking portion for locking the engagement piece. The first housing 11 and the second housing 12 may be assembled by a fastening member such as a screw or a bolt instead of the snap-fit.

A circuit substrate 21 and a connector 31 are accommodated inside the housing 10. An integrated circuit element 14 and the connector 31 are mounted on the circuit substrate 21. The integrated circuit element 14 is, for example, a flip chip ball grid array (FCBGA) type semiconductor device. The integrated circuit element 14 is mounted on the circuit substrate 21 by a bonding material such as solder.

As illustrated in FIGS. 1B and 2A, an opening 13 is provided on one side portion of the housing 10 in the longitudinal direction (+X direction). The opening 13 may be provided in the first housing 11 or may be provided in the second housing 12. The opening 13 may be formed by providing a divided opening to be a part of the opening 13 in each of the first housing 11 and the second housing 12 and assembling the first housing 11 and the second housing 12. Hereinafter, it is assumed that the opening 13 is formed in the second housing 12.

The circuit substrate 21 is fixed to a boss (not shown) or the like provided in the housing 10 using a fastening member such as a screw. The second housing 12 has a shape in which a region in which the connector 31 is accommodated becomes higher toward the upper side (+Z direction). A plurality of (four in the present embodiment) conductors 121 to 124 are provided inside the region 12a of the second housing 12, that is, on the inner surface of the upper portion. The conductors 121 to 124 are arrayed at intervals along the direction in which the leakage electromagnetic wave propagates, in other words, in the +X direction. The leakage electromagnetic wave and the direction in which the leakage electromagnetic wave propagates will be described later. The conductor 121 to 124 is formed integrally with the second housing 12 and have an end portion 126 extending toward the connector 31 side.

Note that the conductors 121 to 124 may be manufactured as a separate member from the second housing 12 and attached to the second housing 12 by welding, fastening, or the like. When the conductors 121 to 124 are manufactured as a separate member, workability is improved by integrally providing the four conductors 121 to 124 on the conductive support member and attaching the support member to the second housing 12.

The first housing 11 and the second housing 12 are each formed of a resin material excelling in moldability and weight reduction, such as polybutylene terephthalate (PBT, e.g., a resin containing conductive filler). The first housing 11 and the second housing 12 can be formed of a sheet metal such as iron or a metal material having excellent thermal conductivity such as the ADC 12 which is aluminum or aluminum alloy, and durability and heat dissipation can be improved.

The integrated circuit element 14 is, for example, a flip chip ball grid array (FCBGA) type semiconductor device that involves heat generation. The FCBGA includes a semiconductor chip and an interposer substrate, and has a structure in which the semiconductor chip is flip-chip mounted on the interposer substrate by a bonding material (not illustrated) such as solder. A bonding material such as a plurality of solder balls is formed on the surface of the interposer substrate on the side opposite to the semiconductor chip, and the interposer substrate is electrically connected to the circuit substrate 21 by the bonding material.

FIG. 1B illustrates a structure in which one integrated circuit element 14 is mounted on the circuit substrate 21, but a passive element such as a capacitor (not illustrated) is also mounted on the circuit substrate 21. The circuit substrate 21 is formed of, for example, an organic material such as an epoxy resin or a metal material, and is particularly preferably formed of FR4 (glass epoxy substrate). The circuit substrate 21 is provided with a plurality of through holes (not illustrated), and the signal wirings 22 are connected to each other or the signal wiring 22 and the ground wiring 23 are connected to each other via the through holes.

The circuit substrate 21 is a multilayer wiring substrate including a signal wiring 22, a ground wiring 23, and an insulating layer 24, in which an intermediate insulating layer 24a is formed between the signal wiring 22 and the ground wiring 23.

The integrated circuit element 14 is connected to the signal wiring 22 and the ground wiring 23 of the circuit substrate 21. In addition, the signal wiring 22 and the ground wiring 23 of the circuit substrate 21 are connected to a signal conductor 33 and a ground conductor 35 (see FIG. 3) of the connector 31 illustrated in FIG. 3, respectively.

The connector 31 includes a coaxial cable 32. An end portion of the connector 31 on a side opposite to the circuit substrate 21 (+X direction side) protrudes to the outside from the opening 13, and the coaxial cable 32 is connected to an external device, for example, an external recognition sensor such as a camera. The electronic control device 100 is used, for example, as a device that processes data transmitted from an external device via the coaxial cable 32 at high speed in real time.

Figure 3:
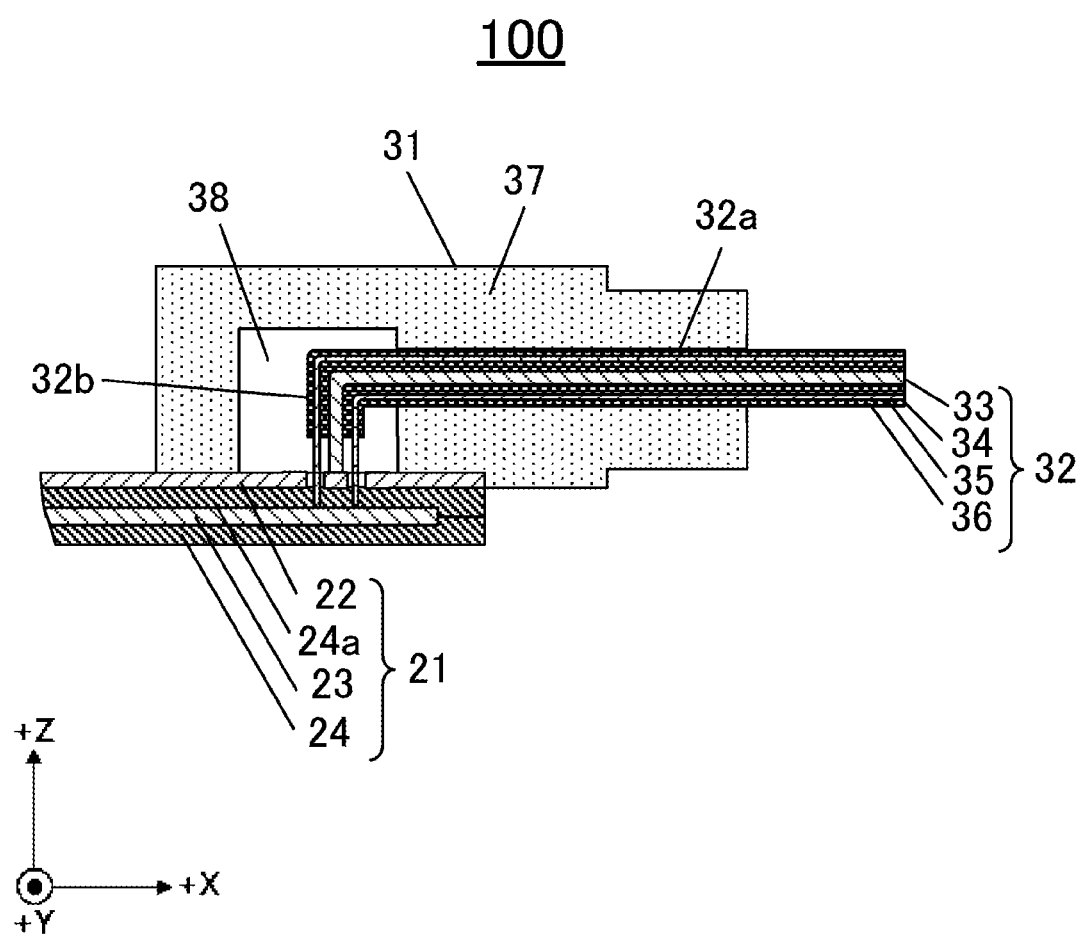
FIG. 3 is an enlarged cross-sectional view illustrating a connection structure between a connector and a circuit substrate illustrated in FIG. 1B.

FIG. 3 is an enlarged cross-sectional view illustrating a connection structure between a connector and a circuit substrate illustrated in FIG. 1B.

The connector 31 includes a connector main body 37 formed of an insulating resin and having a rectangular cross section with a hollow portion 38 inside, and the coaxial cable 32 inserted into the hollow portion 38 of the connector main body 37. As illustrated in FIG. 2A, the connector 31 includes a lower surface 31a disposed on the circuit substrate 21 side, an upper surface 31b disposed on the side opposite to (+Z direction) to the lower surface 31a, a left side surface 31c (see FIG. 1A) disposed in the +Y direction, and a right side surface 31d disposed in the −Y direction.

The conductor 124 (see FIG. 1B) provided at the final end in the +X direction has an upper wall portion 124a, a left wall portion 124b, and a right wall portion 124c. Each of the end faces 126 of the upper wall portion 124a, the left wall portion 124b, and the right wall portion 124c is disposed with a gap 131 from each of the upper surface 31b, the left side surface 31c, and the right side surface 31d of the connector 31. The conductor 121 has the same shape as the conductor 124, and has an upper wall portion 121a, a left wall portion 121b, and a right wall portion 121c as illustrated in FIG. 2B. The conductor 121 has each end face 126 of the upper wall portion 121a, the left wall portion 121b, and the right wall portion 121c disposed with a gap 131 from each of the upper surface 31b, the left side surface 31c, and the right side surface 31d of the connector 31. The conductors 122 and 123 have the same structure as the conductor 121.

Therefore, the outer peripheral surface of the connector 31 is disposed to face the inner peripheral surface of the conductor 121 to 124. A gap 131 over the entire length in the X direction is formed between the inner peripheral surface of the conductor 121 to 124 and each of the upper surface 31b, the left side surface 31c, and the right side surface 31d of the connector 31.

As illustrated in FIG. 3, the coaxial cable 32 has a circular cross section, and has a structure in which the outer periphery of the signal conductor 33 provided at the center is surrounded by the ground conductor 35 via an intermediate insulator 34, and the outer periphery of the ground conductor 35 is covered with a protective insulator 36.

The coaxial cable 32 includes a leading portion 32a extending substantially parallel to the circuit substrate 21 and a rising portion 32b bent in a direction substantially orthogonal from the leading portion 32a and extending toward the circuit substrate 21 side. An end portion of the signal conductor 33 of the coaxial cable 32 is connected to the signal wiring 22 of the circuit substrate 21. An end portion of the ground conductor 35 of the coaxial cable 32 is connected to the ground wiring 23 of the circuit substrate 21. As illustrated in FIG. 3, the signal conductor 33 and the ground conductor 35 of the coaxial cable 32, and the signal wiring 22 and the ground wiring 23 of the circuit substrate 21 respectively have different cross-sectional shapes.

The internal space of the housing 10, the plurality of conductors 121 to 124 provided in the second housing 12, and the connector 31 constitute a leakage electromagnetic wave attenuating structure that suppresses a leakage electromagnetic wave propagating in the radio wave path $W_R$. That is, the electronic control device 100 of the present embodiment has a leakage electromagnetic wave attenuating structure inside the housing 10. This will be described below.

A high frequency signal output from the integrated circuit element 14 is transmitted to the connector 31 via the signal wiring 22. When a signal transmitted from the integrated circuit element 14 to the circuit substrate 21 is propagated as an electromagnetic wave in the circuit substrate 21, the signal is coupled between the signal transmission path, that is, the signal wiring 22 and the ground wiring 23. As described above, the signal conductor 33 and the ground conductor 35 of the coaxial cable 32, and the signal wiring 22 and the ground wiring 23 of the circuit substrate 21 respectively have different cross-sectional shapes.

Therefore, when the electromagnetic wave reaches the connection portion between the circuit substrate 21 and the coaxial cable 32, not all of the electromagnetic waves can transition to the coupling between the signal conductor 33 and the ground conductor 35 of the connector 31, and some of the electromagnetic waves leaks due to the change in the cross-sectional shape of the signal transmission path. The leaked electromagnetic wave is coupled between a connection portion between the ground conductor 35 of the connector 31 and the ground wiring 23 of the circuit substrate 21 and the housing 10 having conductivity. The leakage electromagnetic wave coupled at the connection portion between the connector 31 and the circuit substrate 21 propagates from the connection portion side of the connector 31 and the circuit substrate 21 toward the opening 13 side with a space between the housing 10 and the ground conductor 35 of the connector 31 as a waveguide. Then, the leakage electromagnetic wave propagated to the connector 31, that is, the electromagnetic noise is radiated from the connector 31 to the outside of the electronic control device 100.

On the other hand, the electronic control device 100 of the present embodiment includes the radio wave path $W_R$ in which the plurality of conductors 121 to 124 are arrayed along the direction in which the leakage electromagnetic wave propagates. It is known that when the cross-sectional shape of the waveguide through which the electromagnetic wave propagates changes discontinuously, the characteristic impedance of the waveguide fluctuates discontinuously, and the propagating electromagnetic wave attenuates. Here, the fact that the cross-sectional shape of the waveguide changes discontinuously means that the cross-sectional shape does not change smoothly, but the magnitude of the cross-sectional area suddenly changes at a position of one predetermined point in the direction in which the electromagnetic wave propagates in the waveguide like a structure in which a wall protruding in a direction perpendicular to the direction in which the electromagnetic wave propagates is formed.

The present invention is obtained by applying the above principle, and the cross-sectional area of the radio wave path $W_R$ discontinuously changes a plurality of times at the positions of the plurality of conductors 121 to 124 provided in the radio wave path $W_R$. Therefore, the electromagnetic wave propagating in the radio wave path $W_R$ gradually decreases while propagating through the radio wave path $W_R$.

That is, in the electronic control device 100 of the present embodiment, the plurality of conductors 121 arrayed along the direction in which the leakage electromagnetic wave propagates forms the leakage electromagnetic wave attenuating structure provided in the radio wave path $W_R$, so that can the leakage electromagnetic wave can be attenuated.

EXAMPLE

A radiation electric field intensity of the electronic control device of an example having the structure illustrated in FIGS. 1 to 3 and a comparative article was compared by simulation.

The comparative article has a structure in which only the conductor 124 (see FIG. 1B) forming the opening 13 of the housing 10 is formed in the radio wave path $W_R$ and the other conductors 121 to 123 are not provided.

The electronic control device of the example and the electronic control device of the comparative article have the same structure, shape, size, and material other than those described above.

Figure 17:
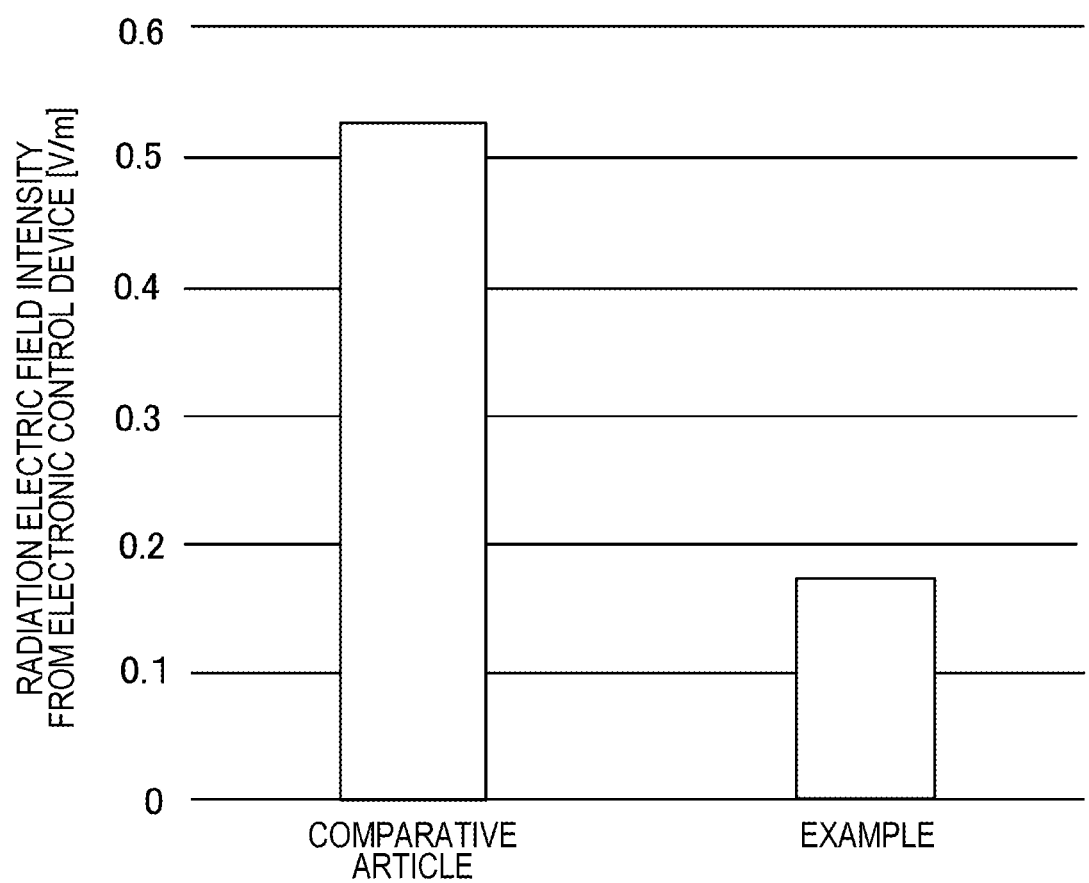
FIG. 17 is a diagram showing the radiation electric field intensities from the electronic control device of the example of the present invention and the comparative article by simulation.

FIG. 17 is a diagram showing simulation results and showing the radiation electric field intensities from the electronic control device of the example of the present invention and the comparative article.

As illustrated in FIG. 17, the radiation electric field intensity from the electronic control device in the example was smaller than that in the comparative example by greater than or equal to 0, 3 V/m (9 dB). Thus, the effect of suppressing the leakage electromagnetic wave by the electronic control device 100 of the present embodiment was confirmed.

The radiation electric field intensity shown in FIG. 17 is a comparison at 3 GHz. The ratio of the radiation electric field intensity of the example to the radiation electric field intensity of the comparative example tended to increase as the frequency increases. Therefore, when the frequency is greater than or equal to 3 GHz, the ratio of the radiation electric field intensity of the example to the radiation electric field intensity of the comparative example becomes larger. Furthermore, the simulation was performed while changing the number of the conductors 121 from 2 to 6, but there was no large difference in the radiation electric field intensity.

Modified Example of First Embodiment

Figure 4:
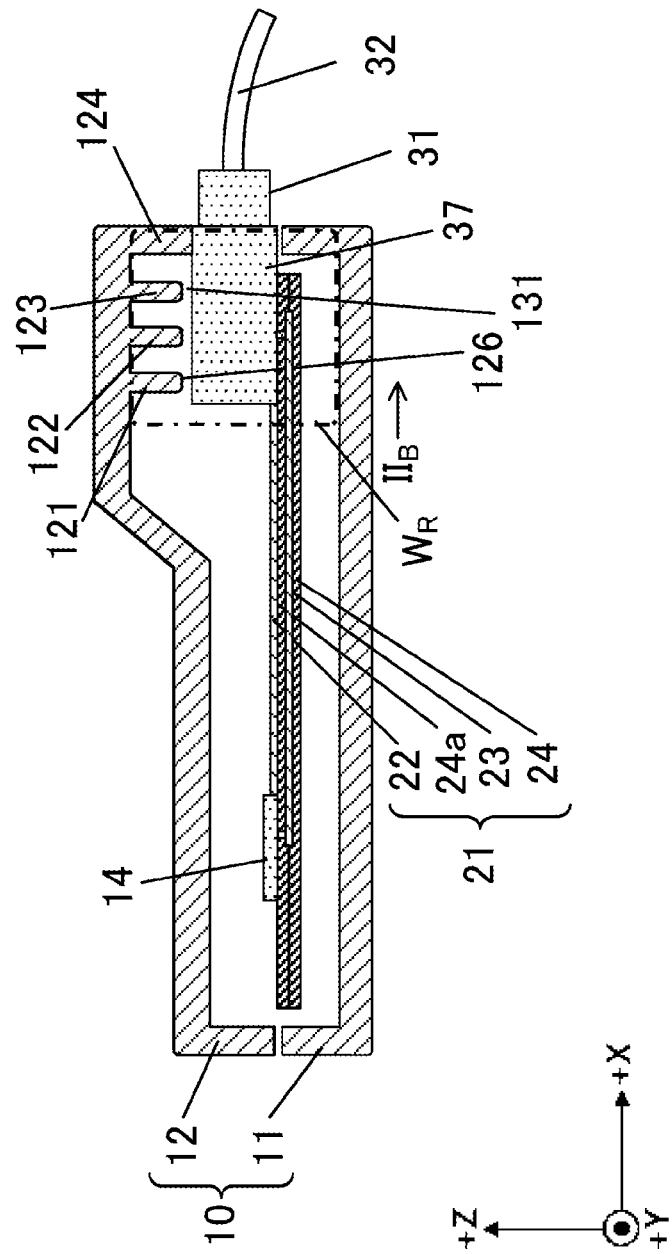
FIG. 4 illustrates a modified example of the first embodiment and is a diagram corresponding to FIG. 1B.

FIG. 4 illustrates a modified example of the first embodiment and is a diagram corresponding to FIG. 1B of the first embodiment.

The modified example has a structure in which, among the plurality of conductors 121 to 124 provided in the radio wave path $W_R$, the end face 126 of the conductor 124 forming the opening 13 of the housing 10 is in contact with the upper surface 31b of the connector main body 37.

As in the first embodiment, the end face 126 of the other conductor 121 other than the conductor 124 is separated from the upper surface 31b of the connector main body 37.

As described above, even when the conductor 124 at the final end in the direction in which the leakage electromagnetic wave propagates among the plurality of conductors 121 to 124 provided in the radio wave path $W_R$ is brought into contact with the upper surface 31b of the connector 31, the same effects as those of the first embodiment are obtained.

Note that the lower surface of the opening 13 of the housing 10 may be brought into contact with the lower surface 31a of the connector 31. Furthermore, the left and right side surfaces of the opening 13 of the housing 10 may be brought into contact with the left side surface 31c and/or the right side surface 31d of the connector 31.

In the structure in which the continuous gap 131 is provided between the connector 31 and the end faces 126 of the plurality of conductors 121 to 124 over the entire length of the radio wave path $W_R$ as in the first embodiment, reliability with respect to vibration can be improved. That is, when vibration is applied to the electronic control device 100, the vibration of the housing 10 is transmitted to the circuit substrate 21 via the connector 31, and stress concentrates on a bonding material such as solder bonding each part of the circuit substrate 21. As a result, cracks or damages may occur in the bonding material, and defects such as conduction failure may occur. The vibration of the housing 10 can be suppressed from being transmitted to the connector 31 by separating the connector 31 and the plurality of conductors 121 to 124 from each other.

On the other hand, with the structure in which the conductor 124 at the final end in the direction in which the leakage electromagnetic wave propagates is brought into contact with the upper surface 31b of the connector 31 as in the modified example of the first embodiment, water leakage from the outside can be prevented to prevent corrosion of an internal conductor material and to seal the inside of the electronic control device 100.

The first embodiment has the following effects.
(1) The electronic control device 100 includes a leakage electromagnetic wave attenuating structure in which a radio wave path $W_R$ in which a leakage electromagnetic wave propagates from one end of the connector 31 on the circuit substrate 21 side toward the other end on the side opposite to the circuit substrate 21 side is formed in an internal space at the periphery of the connector 31 of the housing 10, and the leakage electromagnetic wave attenuating structure includes a plurality of conductors 121 to 124 arrayed along a direction in which the leakage electromagnetic wave propagates from one end of the connector 31 and configured to attenuate the leakage electromagnetic wave propagating through the radio wave path $W_R$. The cross-sectional area of the radio wave path $W_R$ discontinuously changes a plurality of times by the plurality of conductors 121 to 124 arrayed in the radio wave path $W_R$. It is known that when the cross-sectional shape of the radio wave path $W_R$ changes discontinuously, the characteristic impedance of the radio wave path $W_R$ fluctuates discontinuously, and the radio wave propagating through the radio wave path $W_R$ attenuates. Therefore, the leakage electromagnetic wave propagating in the radio wave path $W_R$ between the housing 10 and the connector 31 is suppressed.
(2) The plurality of conductors 121 to 124 are integrated with the housing 10. Therefore, the work of attaching the conductors 121 to 124 to the housing 10 becomes unnecessary, and productivity can be improved.
(3) The housing 10 has an opening 13 through which the radio wave path $W_R$ communicates with the outside of the housing 10, and the other end of the connector 31 protrudes from the opening 13 to the outside of the housing 10. Since the leakage electromagnetic wave propagating in the radio wave path $W_R$ between the housing 10 and the connector 31 is suppressed, the leakage electromagnetic wave radiated from the connector 31 to the outside of the housing 10 can be reduced.

(4) A continuous gap 131 is provided over the entire length of the radio wave path $W_R$ between at least one side surface 31a to 31d of the connector 31 and the end faces 126 on the connector 31 side of the plurality of conductors 121 to 124. As a result, even when vibration is applied to the electronic control device 100, it is possible to suppress the occurrence of defects such as cracks and damages in a bonding material such as solder bonding each part of the circuit substrate 21 and the occurrence of conduction failures.

Second Embodiment

Figure 5:
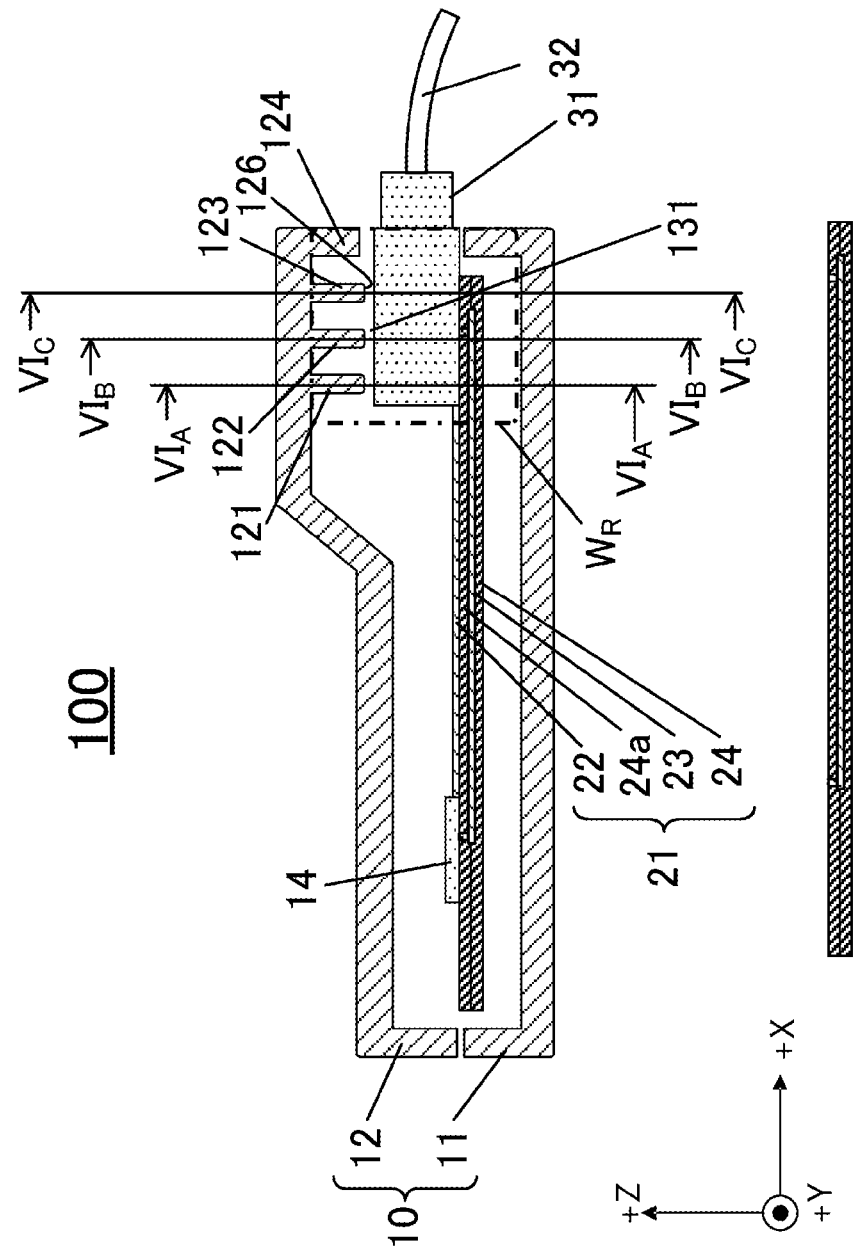
FIG. 5 is a cross-sectional view of a second embodiment of the electronic control device of the present invention.

FIG. 5 is a cross-sectional view of a second embodiment of the electronic control device of the present invention.

Figure 6A:
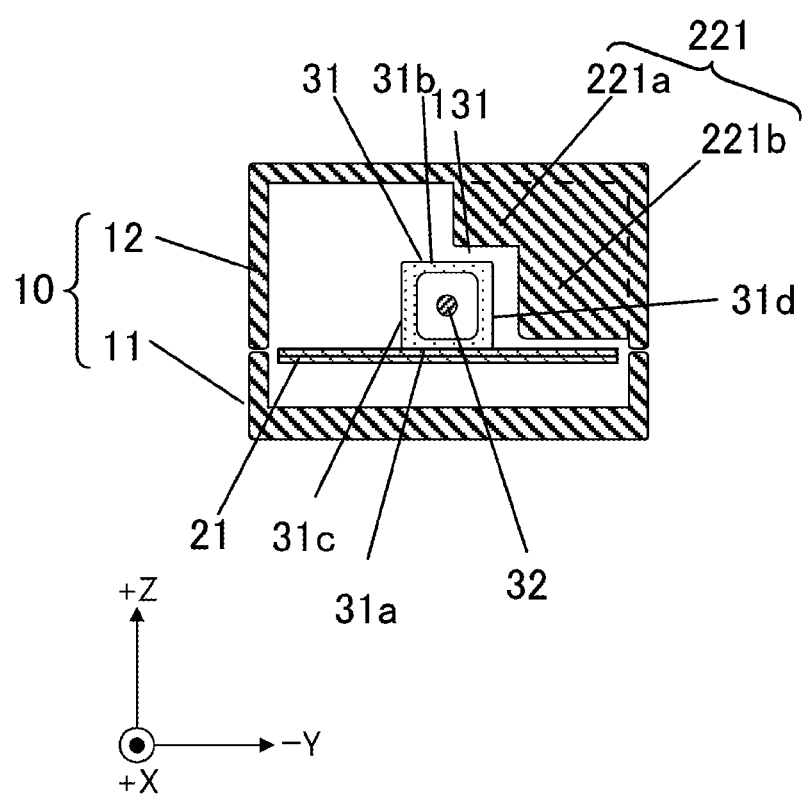
FIG. 6A is a cross-sectional view taken along line $VI_A$-$VI_A$ of the electronic control device illustrated in FIG. 5.
Figure 6B:
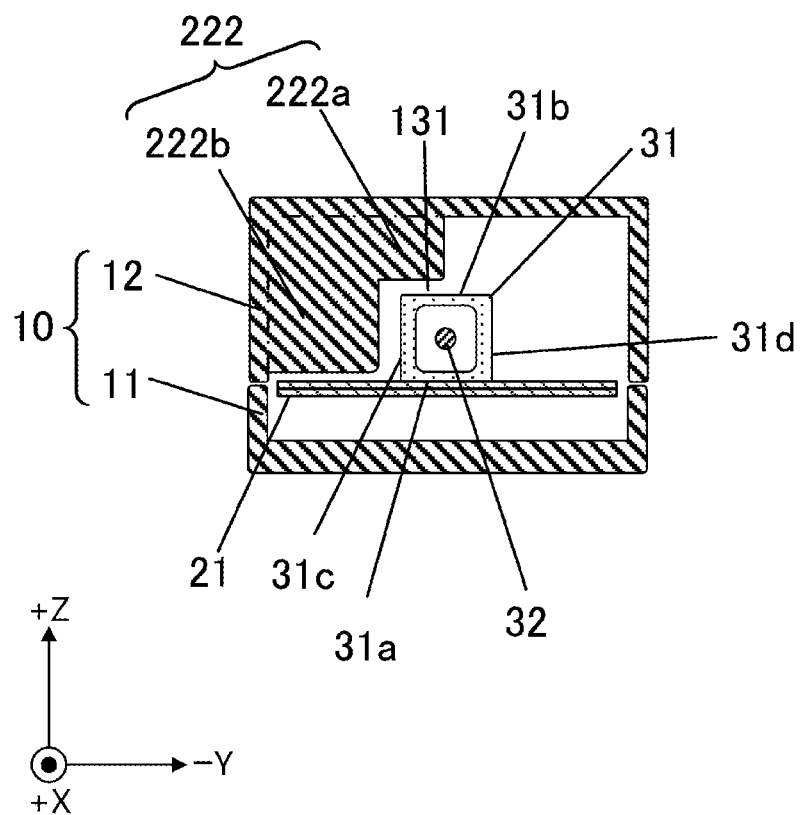
FIG. 6B is a cross-sectional view taken along line $VI_B$-$VI_B$ of the electronic control device illustrated in FIG. 5.
Figure 6C:
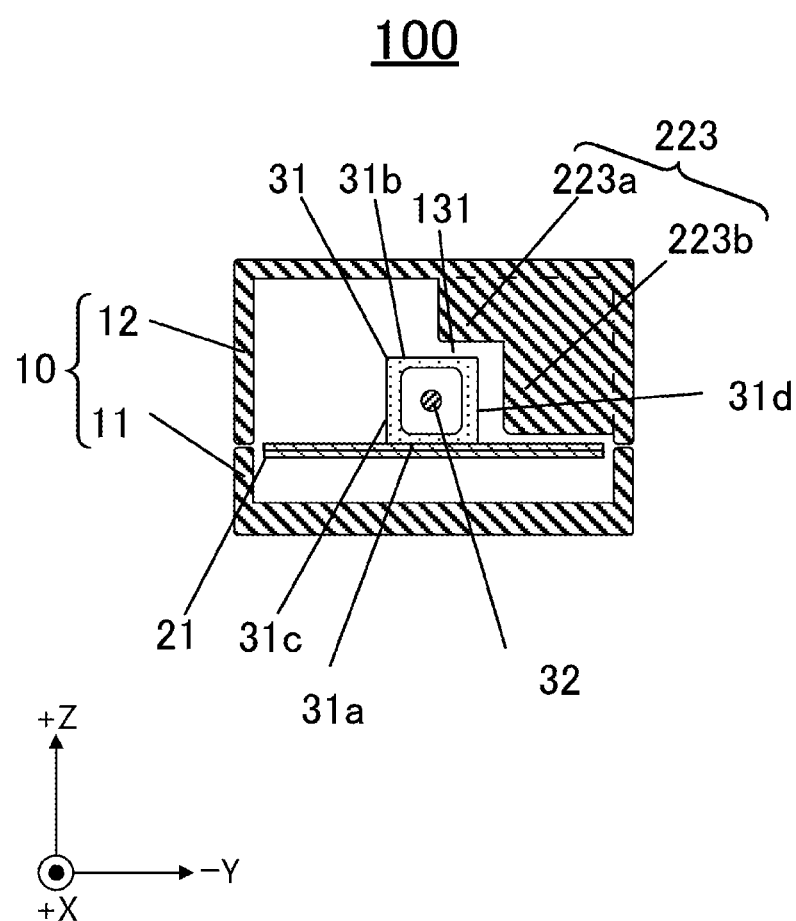
FIG. 6C is a cross-sectional view taken along line $VI_C$-$VI_C$ of the electronic control device illustrated in FIG. 5.

FIG. 6A is a cross-sectional view taken along line $VI_A$-$VI_A$ of the electronic control device illustrated in FIG. 5, FIG. 6B is a cross-sectional view taken along line $VI_B$-$VI_B$ of the electronic control device illustrated in FIG. 5, and FIG. 6C is a cross-sectional view taken along line $VI_C$-$VI_C$ of the electronic control device illustrated in FIG. 5.

The electronic control device 100 of the second embodiment shows an example of a structure in which conductors 221 to 224 arrayed in the radio wave path $W_R$ have different shapes.

In the following description, only the configuration in which the second embodiment is different from the first embodiment will be described, and the description of the same configuration as the first embodiment will be omitted.

As illustrated in FIG. 6A, the conductor 221 formed first in the +X direction which is the leftmost side of the radio wave path $W_R$ has an upper half wall portion 221a arranged with a gap 131 from the right side (−Y direction side) half of the upper surface 31b of the connector 31 and a right wall portion 221b arranged with a gap 131 on the right side surface 31d of the connector 31.

As illustrated in FIG. 6B, the conductor 222 formed second in the +X direction of the radio wave path $W_R$ has an upper half wall portion 222a arranged with a gap 131 from the left side (+Y direction side) half of the upper surface 31b of the connector 31 and a left wall portion 222b arranged with a gap 131 on the left side surface 31c of the connector 31.

As illustrated in FIG. 6C, similar to the conductor 221, the conductor 223 formed third in the +X direction of the radio wave path $W_R$ has an upper half wall portion 223a arranged with a gap 131 from the right side (−Y direction side) half of the upper surface 31b of the connector 31 and a right wall portion 223b arranged with a gap 131 on the right side surface 31d of the connector 31.

The conductor 224 formed at the final end in the direction in which the electromagnetic wave propagates of the radio wave path $W_R$ has the same structure as the conductor 124 of the first embodiment.

Modified Example of Second Embodiment

Figure 7:
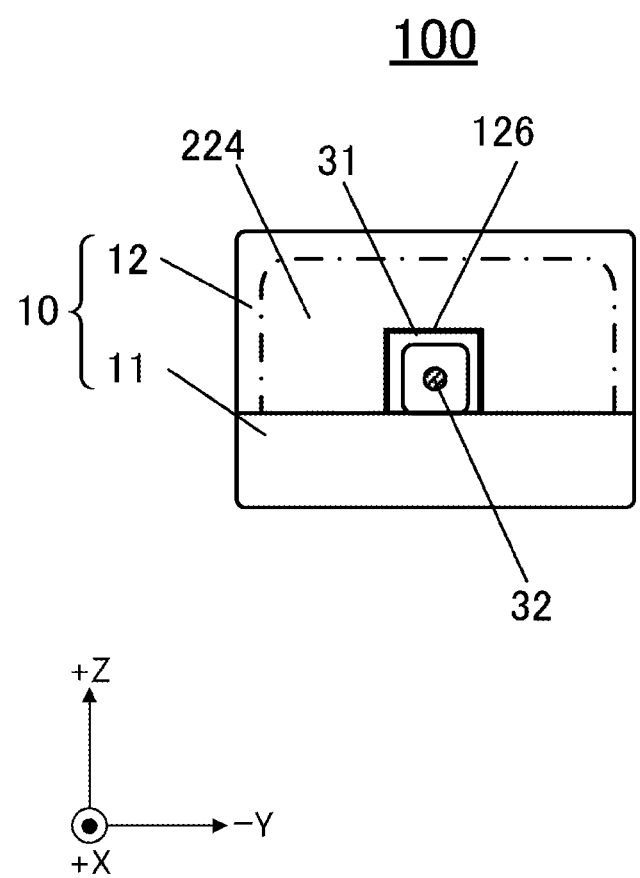
FIG. 7 illustrates a modified example of the second embodiment and is a diagram corresponding to FIG. 2A of the first embodiment.

FIG. 7 illustrates a modified example of the second embodiment and is a diagram corresponding to FIG. 2A of the first embodiment.

FIG. 7 has a structure in which the conductor 224 formed at the final end in the direction in which the electromagnetic wave propagates of the radio wave path $W_R$ is brought into contact with the upper surface 31b, the left side surface 31c, and the right side surface 31d of the connector 31. As described above, the opening 13 of the housing 10 may be closed by the conductor 224 formed at the final end in the direction in which the electromagnetic wave propagates of the radio wave path $W_R$.

Other configurations of the second embodiment are similar to those of the first embodiment.

In the second embodiment, the upper half wall portion 221a of the conductor 221 and the upper half wall portion 222a of the conductor 222 constitute one wall portion corresponding to the entire upper surface 31b of the connector 31.

In addition, the right wall portion 221b of the conductor 221 and the right wall portion 223b of the conductor 223 are wall portions on the right side surface 31d side of the connector 31, and the left wall portion 222b of the conductor 222 is a wall portion on the left side surface 31c side of the connector 31. That is, the wall portion on the left side surface 31c side and the wall portion on the right side surface 31d side of the connector 31 are formed in the conductors 221 to 223 having different radio wave paths $W_R$. In this manner, the conductors 221 to 223 may be formed to different shapes to constitute wall portions corresponding to the wall portions of each of side surfaces of the outer periphery of the connector 31.

In the second embodiment as well, the electronic control device 100 has a leakage electromagnetic wave attenuating structure including a plurality of conductors arrayed along the direction in which the leakage electromagnetic wave propagates from one end of the connector 31 and configured to attenuate the leakage electromagnetic wave propagating through the radio wave path $W_R$.

Therefore, the second embodiment also has the same effects as the effects (1) to (4) of the first embodiment.

In addition, the second embodiment is a structure that is effective in a case where the conductor 221 to 223 cannot have the same shape due to restrictions in the internal structure of the housing 10, the shape and arrangement of components to be mounted, and the like. That is, the second embodiment has an effect of reducing restrictions on the internal structure of the housing 10, the layout such as the shape and arrangement of components to be mounted, and the like, and widening the application range of the electronic control device having the leakage electromagnetic wave attenuating structure.

Third Embodiment

Figure 8:
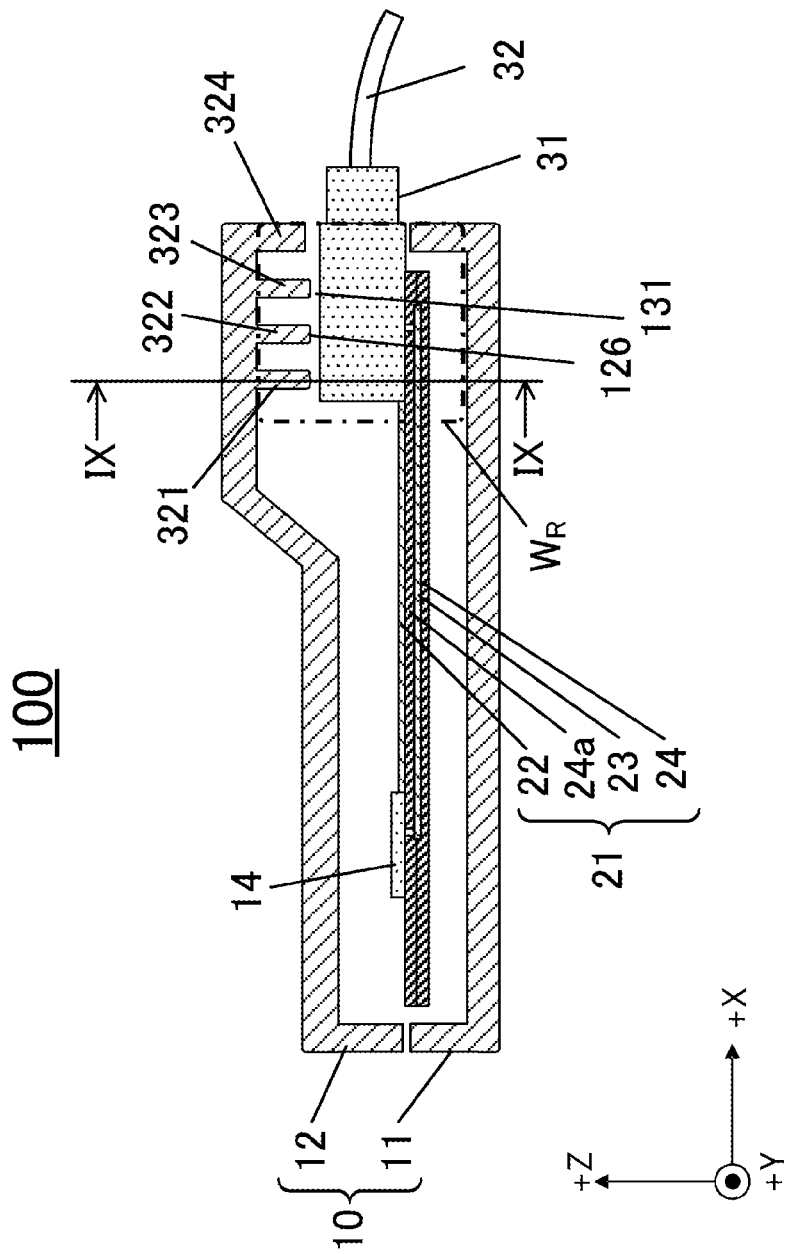
FIG. 8 is a cross-sectional view of a third embodiment of the electronic control device of the present invention.
Figure 9:
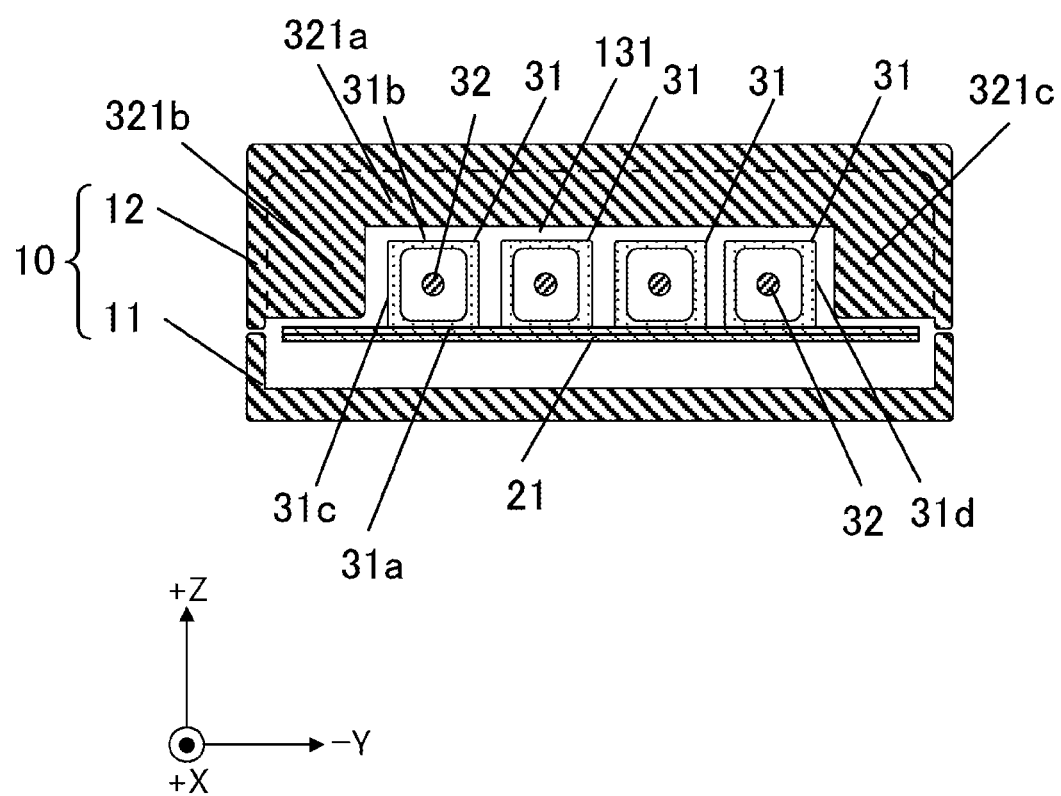
FIG. 9 is a cross-sectional view taken along line IX-IX of the electronic control device illustrated in FIG. 8.

FIG. 8 is a cross-sectional view of a third embodiment of the electronic control device of the present invention, and FIG. 9 is a cross-sectional view taken along line IX-IX of the electronic control device illustrated in FIG. 8.

The electronic control device 100 of the third embodiment shows an example of a leakage electromagnetic wave attenuating structure in a structure in which a plurality of connectors 31 are mounted on a circuit substrate 21.

In the following description, only the configuration in which the third embodiment is different from the first embodiment will be described, and the description of the same configuration as the first embodiment will be omitted.

As illustrated in FIG. 9, a plurality of (four in the embodiment) connectors 31 are mounted on the circuit substrate 21. The plurality of connectors 31 are arrayed at substantially equal intervals in the Y direction.

In the radio wave path $W_R$, four conductors 321 to 324 are arrayed in a direction orthogonal to the arraying direction of the plurality of connectors 31. The four conductors 321 to 324 are integrally formed with the second housing 12.

The conductor 324 provided at the final end in the +X direction, in other words, the conductor 324 forming the opening 13 of the housing 10 is disposed with a gap 131 from each of the upper surface 31b, the left side surface 31c, and the right side surface 31d of the connector 31, similarly to the conductor 124 of the first embodiment.

The conductor 321 has an upper wall portion 321a provided continuously with a gap 131 on the upper surface 31b side of the four connectors 31, including between the connectors 31. In addition, the conductor 321 has a left wall portion 321b arranged with a gap 131 on the left side surface 31c side of the connector 31 located at the end portion in the +Y direction. In addition, the conductor 321 has a right wall portion 321c arranged with a gap 131 on the right side surface 31d side of the connector 31 located at the end portion in the −Y direction. The conductors 322 and 323 have the same structure as the conductor 321 and have the structure illustrated in FIG. 9.

That is, the conductor 321 to 324 is provided in three directions of the upper portion side, the left side, and the right side surrounding the four connectors 31, and does not have a wall interposed between the connectors 31. Since the conductor 321 to 324 is not provided between the plurality of connectors 31, the plurality of connectors 31 can be arrayed at small intervals, and the density can be increased.

Other configurations of the third embodiment are similar to those of the first embodiment.

Therefore, the third embodiment also has the same effects as the effects (1) to (4) of the first embodiment.

Note that the plurality of connectors 31 may have different structures. In addition, a structure in which a wall portion of a conductor is interposed between the connectors 31 may be adopted.

Fourth Embodiment

Figure 10:
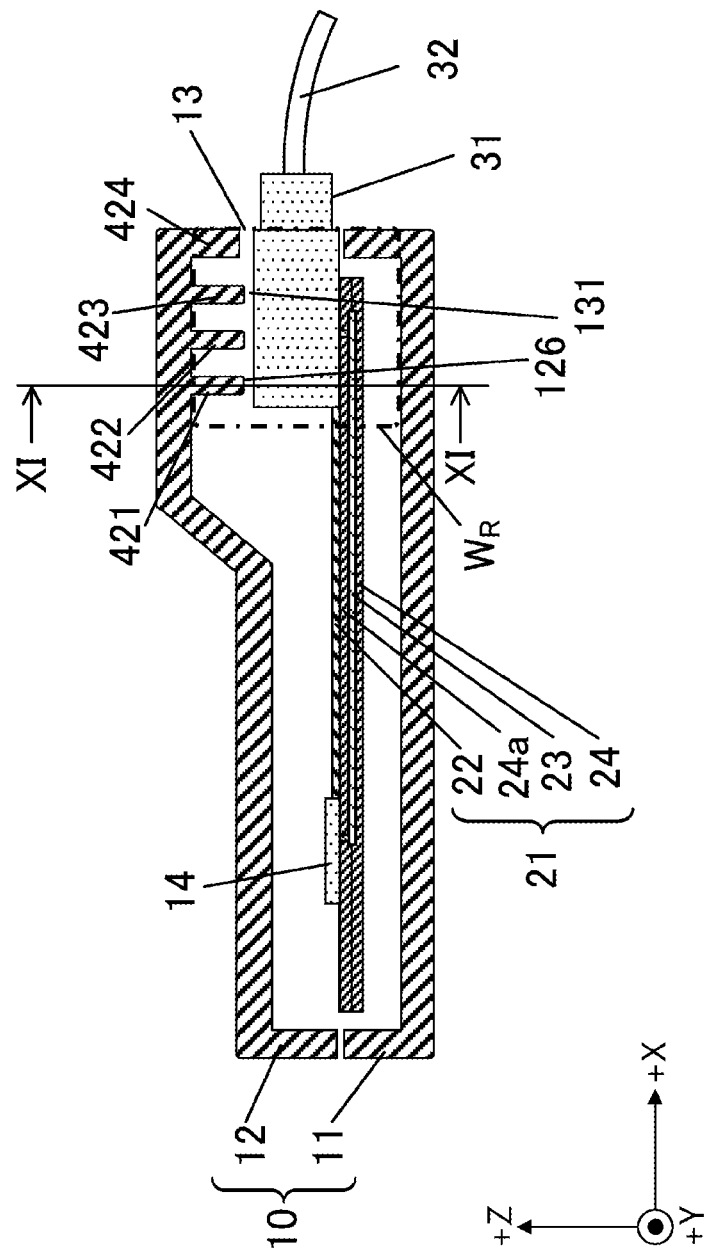
FIG. 10 is a cross-sectional view of a fourth embodiment of the electronic control device of the present invention.
Figure 11:
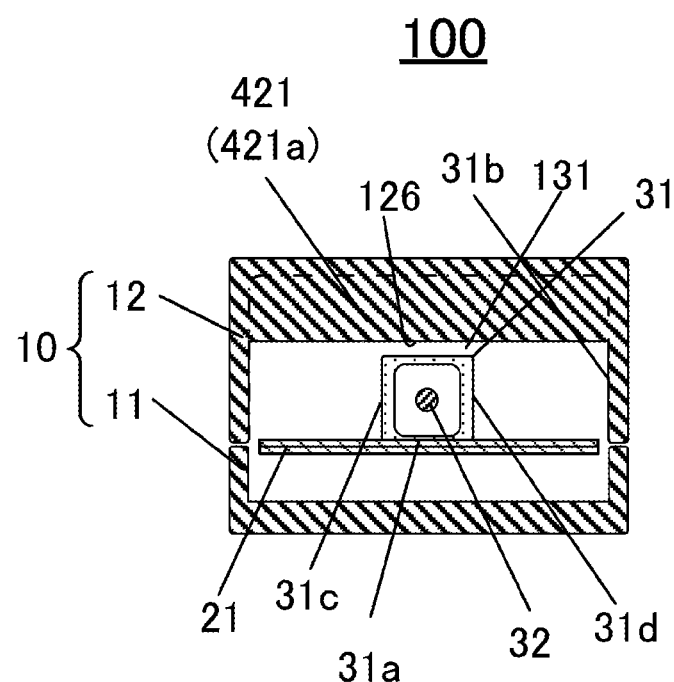
FIG. 11 is a cross-sectional view taken along line XI-XI of the electronic control device illustrated in FIG. 10.

FIG. 10 is a cross-sectional view of a fourth embodiment of the electronic control device of the present invention, and FIG. 11 is a cross-sectional view taken along line XI-XI of the electronic control device illustrated in FIG. 10.

The electronic control device 100 of the fourth embodiment has a structure in which the left wall portion and the right wall portion are not provided in the three conductors 421 to 423 among the four conductors 421 to 424.

In the following description, only the configuration in which the fourth embodiment is different from the first embodiment will be described, and the description of the same configuration as the first embodiment will be omitted.

As illustrated in FIG. 11, the conductor 421 has only an upper wall portion 421a arranged with a gap 131 on the upper surface 31b side of the connector 31. The conductor 421 does not have wall portions disposed on the left side surface 31c side and the right side surface 31d side of the connector 31. The conductors 422 and 423 have the same structure as the conductor 421 and have the structure illustrated in FIG. 11.

The conductor 424 has the same structure as the conductor 124 of the first embodiment.

As described above, a structure in which the conductor 421 to 423 has a wall portion corresponding to only one side surface of the outer peripheral side surface of the connector 31 is also included in the leakage electromagnetic wave attenuating structure.

Other configurations of the fourth embodiment are similar to those of the first embodiment.

Therefore, the fourth embodiment also has the same effects as the effects (1) to (4) of the first embodiment.

Note that the fourth embodiment has an effect of reducing restrictions on the internal structure of the housing 10, the layout such as the shape and arrangement of components to be mounted, and the like, and widening the application range of the electronic control device having the leakage electromagnetic wave attenuating structure since the conductor 421 to 423 has a wall portion corresponding to only one side surface of the outer peripheral side surface of the connector 31.

Fifth Embodiment

Figure 12B:
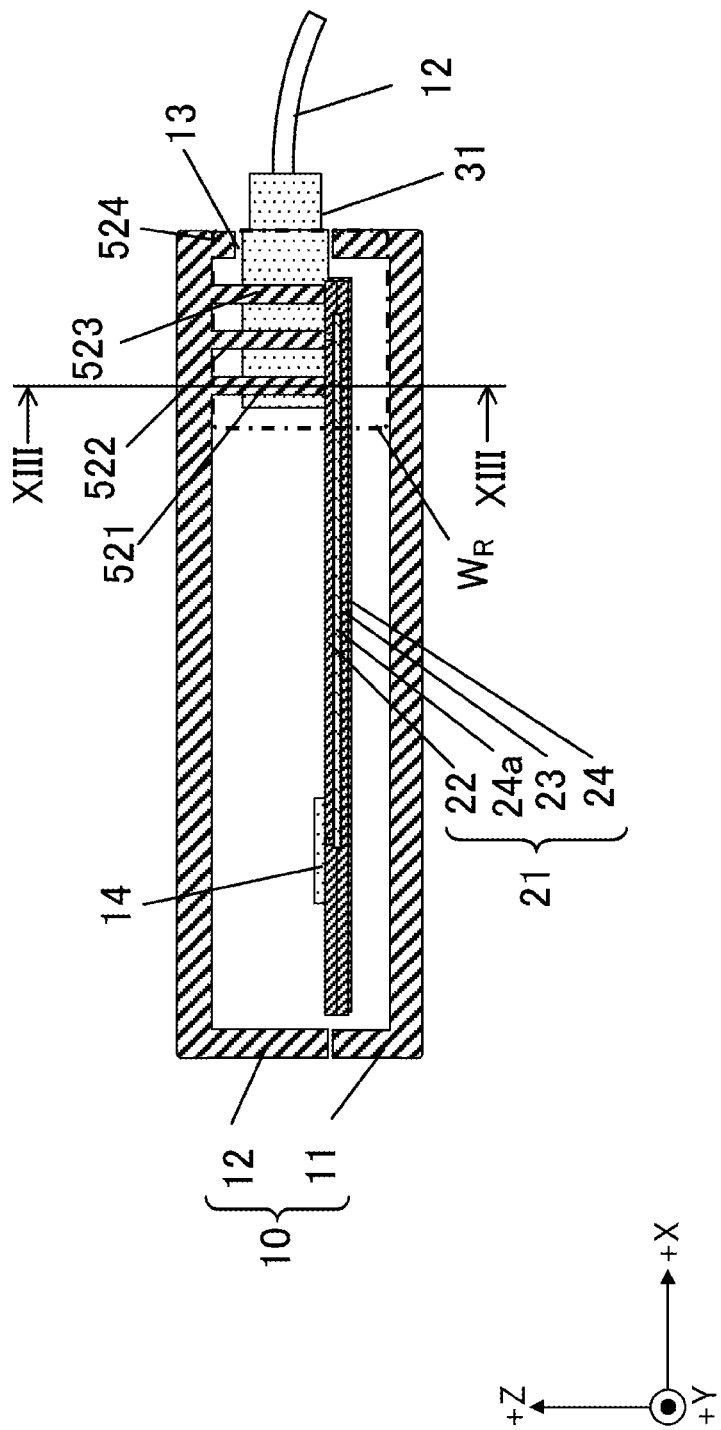
FIG. 12B is a cross-sectional view taken along line $XII_B$-$XII_B$ of the electronic control device illustrated in FIG. 12A.
Figure 13:
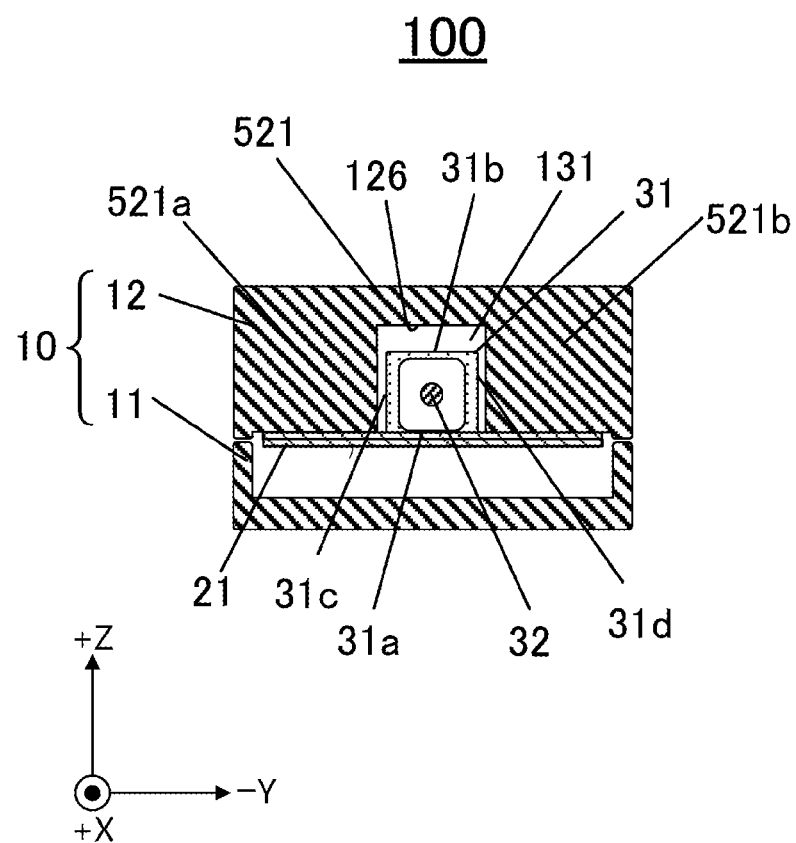
FIG. 13 is a cross-sectional view taken along line XIII-XIII of the electronic control device illustrated in FIG. 12B.

FIG. 12A shows a fifth embodiment of the electronic control device of the present invention, and is a plan view as viewed from above; FIG. 12B is a cross-sectional view taken along line $XII_B$-$XII_B$ of the electronic control device illustrated in FIG. 12A, and FIG. 13 is a cross-sectional view taken along line XIII-XIII of the electronic control device illustrated in FIG. 12B. The electronic control device 100 of the fifth embodiment has a structure in which the upper wall portion is not provided in the conductors 521 to 523 among the conductors 521 to 524.

In the following description, only the configuration in which the fifth embodiment is different from the first embodiment will be described, and the description of the same configuration as the first embodiment will be omitted.

As illustrated in FIG. 12B, the second housing 12 in the fifth embodiment has a flat upper surface, and the entire housing 10 including a region facing the connector 31 has the same height.

As illustrated in FIGS. 13 and 12B, the conductor 521 has a left wall portion 521a arranged with a gap 131 on the left side surface 31c side of the connector 31 and a right wall portion 521b arranged with a gap 131 on the right side surface 31d side of the connector 31. The conductor 521 does not have a wall portion disposed on the upper surface 31b side of the connector 31. The conductors 522 and 523 have the same structure as the conductor 521 and have the structure illustrated in FIG. 13.

The conductor 424 has the same structure as the conductor 124 of the first embodiment.

In the fifth embodiment, wall portions corresponding to two side surfaces of the outer peripheral side surface of the connector 31 are provided. Such a structure is also included in the leakage electromagnetic wave attenuating structure.

Other configurations of the fifth embodiment are similar to those of the first embodiment.

Therefore, the fifth embodiment also has the same effects as the effects (1) to (4) of the first embodiment.

In addition, the fifth embodiment has an effect in that since the conductor 521 to 523 does not have the wall portion disposed on the upper surface 31b side of the connector 31, the height of the electronic control device 100 can be reduced.

Sixth Embodiment

Figure 14:
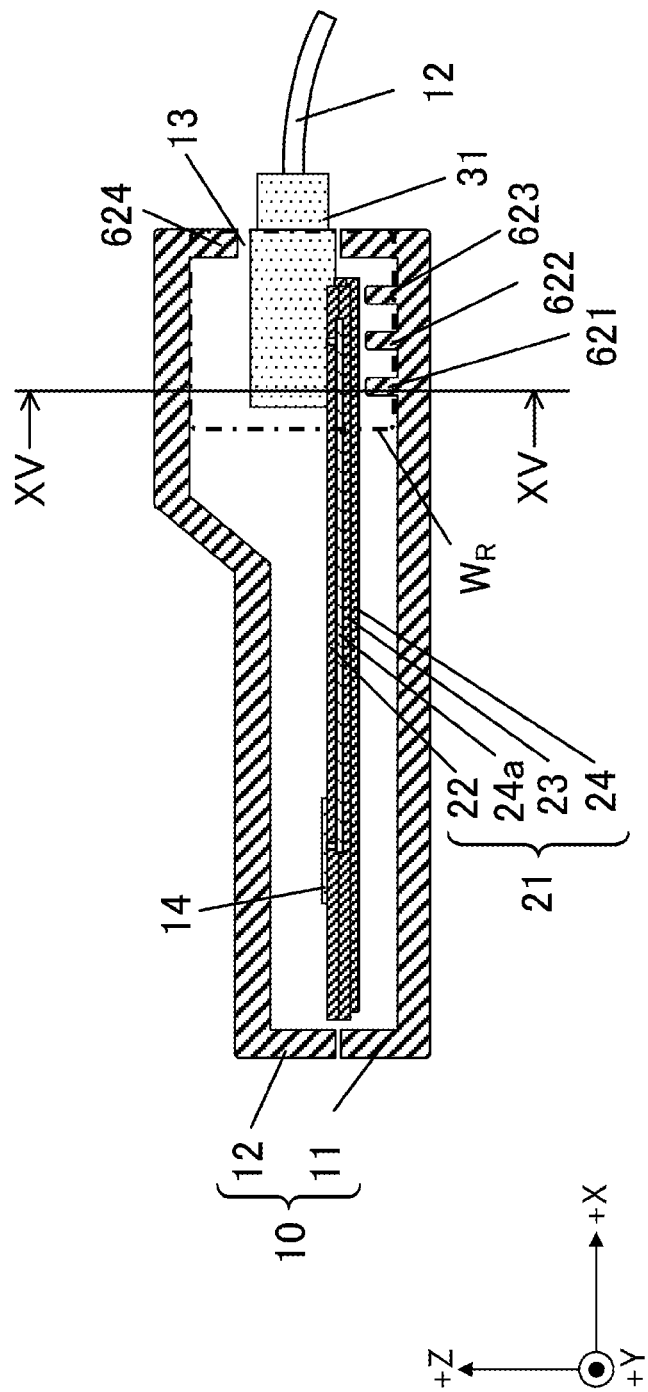
FIG. 14 is a cross-sectional view of a sixth embodiment of the electronic control device of the present invention.
Figure 15:
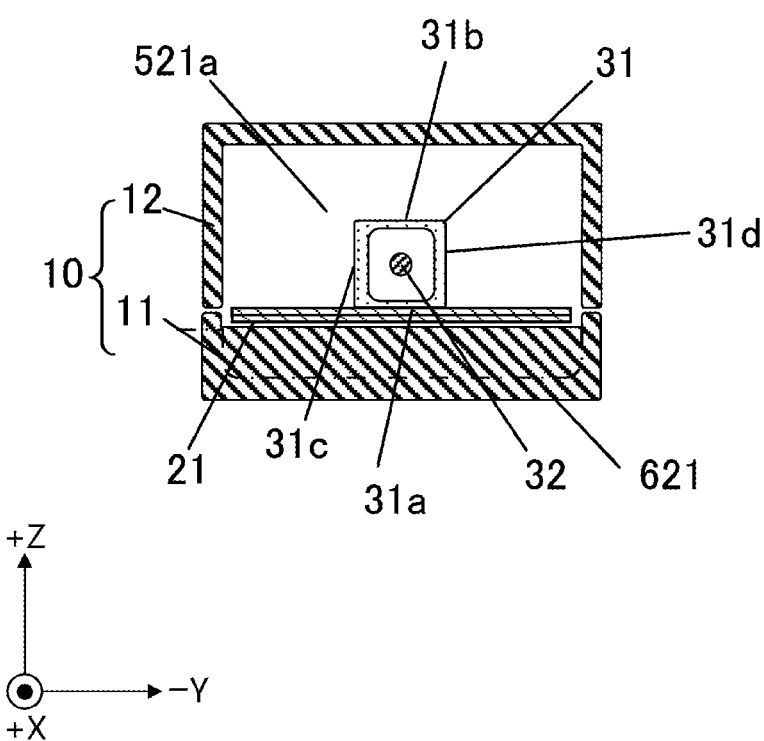
FIG. 15 is a cross-sectional view taken along line XV-XV of the electronic control device illustrated in FIG. 14.

FIG. 14 is a cross-sectional view of a sixth embodiment of the electronic control device of the present invention, and FIG. 15 is a cross-sectional view taken along line XV-XV of the electronic control device illustrated in FIG. 14.

The electronic control device 100 of the sixth embodiment has a structure in which the leakage electromagnetic wave attenuating structure includes a first housing 11 and a circuit substrate 21.

In the following description, only the configuration in which the sixth embodiment is different from the first embodiment will be described, and the description of the same configuration as the first embodiment will be omitted.

As illustrated in FIG. 14, four conductors 621 to 624 are provided in the housing 10. Among them, three conductors 621 to 623 are provided between the first housing 11 and the circuit substrate 21.

As illustrated in FIG. 15, the conductor 621 is provided in the first housing 11 and extends in the Y direction along the circuit substrate 21. The connector 31 is mounted on the circuit substrate 21 with the lower surface 31a facing the circuit substrate 21 side. The conductors 622 and 623 have the same structure as the conductor 621 and have the structure illustrated in FIG. 15. In addition, the conductor 624 has the same structure as the conductor 124 of the first embodiment and has a structure provided on the second housing 12 side. Therefore, in the electronic control device 100 of the sixth embodiment, the internal space of the housing 10, the conductors 621 to 623 provided in the first housing 11, the conductor 624 provided in the second housing 12, and the connector 31 constitute a leakage electromagnetic wave attenuating structure that suppresses leakage electromagnetic wave propagating through the radio wave path $W_R$.

Other configurations of the sixth embodiment are similar to those of the first embodiment.

Therefore, the sixth embodiment also has the same effects as the effects (1) to (4) of the first embodiment.

Seventh Embodiment

Figure 16:
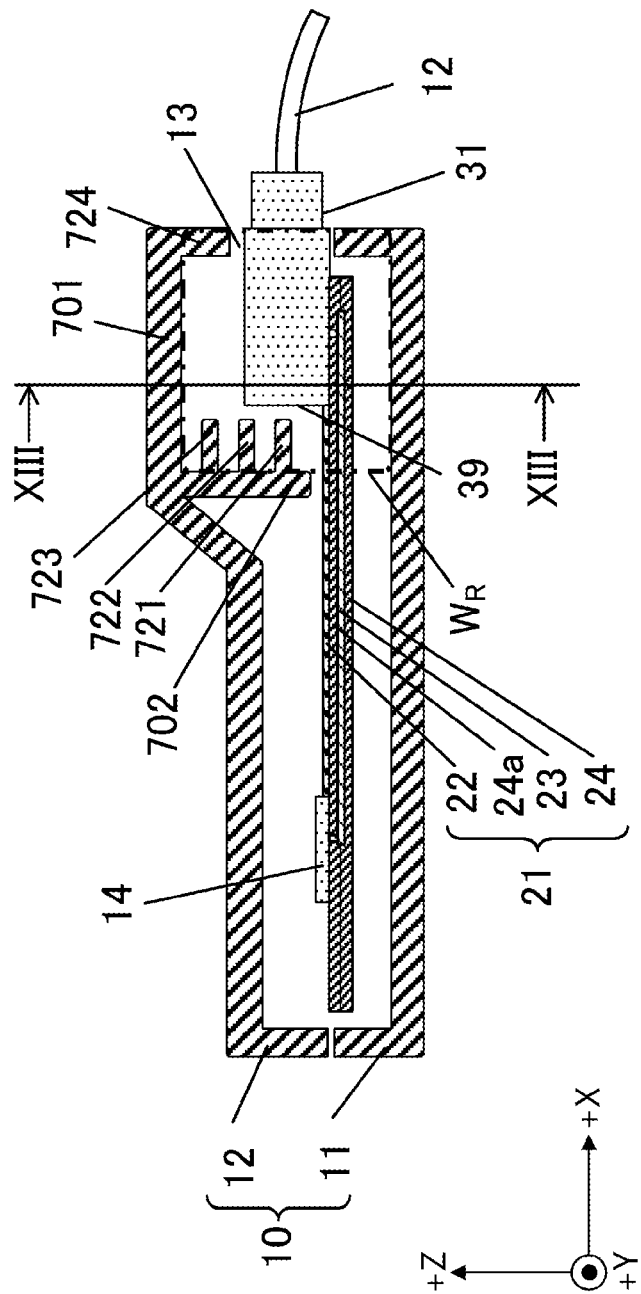
FIG. 16 is a cross-sectional view of a seventh embodiment of the electronic control device of the present invention.

FIG. 16 is a cross-sectional view of a seventh embodiment of the electronic control device of the present invention.

The electronic control device 100 of the seventh embodiment has a structure in which sealed number of conductors 721 to 723 are arrayed along a side surface on the circuit substrate 21 side of the connector 31.

In the following description, only the configuration in which the seventh embodiment is different from the first embodiment will be described, and the description of the same configuration as the first embodiment will be omitted.

As illustrated in FIG. 16, the second housing 12 includes a holding portion 702 extending from a ceiling portion 701 of the second housing 12 toward the circuit substrate 21 on the −X side which is the circuit substrate 21 side with respect to the back side surface 39 on the circuit substrate 21 side of the connector 31. The holding portion 702 is provided with conductors 721 to 723. In addition, the second housing 12 is provided with a conductor 724 that forms the opening 13. The conductor 724 has the same structure as the conductor 124 of the first embodiment.

As illustrated in FIG. 3, the coaxial cable 32 provided in the connector 31 includes a leading portion 32a extending substantially parallel to the circuit substrate 21 and a rising portion 32b bent in a direction substantially orthogonal from the leading portion 32a and extending toward the circuit substrate 21 side. The conductors 721 to 723 are arrayed along the rising portion 32b of the coaxial cable 32. The leakage electromagnetic wave generated at the connection portion between the connector 31 and the circuit substrate 21 propagates along the rising portion 32b. Therefore, the conductors 721 to 723 are arrayed along the direction in which the leakage electromagnetic wave propagates.

Therefore, in the electronic control device 100 of the seventh embodiment, the internal space of the housing 10, the conductors 721 to 724 provided in the holding portion 702 of the second housing 12, and the connector 31 constitute a leakage electromagnetic wave attenuating structure that suppresses leakage electromagnetic wave propagating through the radio wave path $W_R$.

In FIG. 16, the conductor 721 to 723 is illustrated as a structure provided between the holding portion 702 and the back side surface 39 of the connector 31. However, the conductor 721 to 723 may have a structure having walls arranged with a gap also on the side surface on the −Y direction side and also the side surface on the +Y direction side of the connector 31.

Other configurations of the seventh embodiment are similar to those of the first embodiment.

Therefore, the seventh embodiment also has the same effects as the effects (1) to (4) of the first embodiment.

Note that in the embodiment described above, the electronic control device 100 including the connector 31 having the coaxial cable 32 has been exemplified. However, the present invention can be applied to the electronic control device 100 including the connector 31 having the ground conductor and the plurality of signal conductors. As described above, in the connector 31 including the plurality of signal conductors, the radio wave path $W_R$ through which the leakage electromagnetic wave propagates is formed between the conductive housing 10 and the ground conductor of the connector 31.

In the embodiment described above, the integrated circuit element 14 has been exemplified as an FCBGA type semiconductor device. However, the integrated circuit element 14 may be a BGA type other than the FCBGA type. In addition, the integrated circuit element 14 may be an electronic component other than the BGA type.

In the embodiment described above, the housing 10 has been exemplified as a structure including two housing portions of the first housing 11 and the second housing 12. However, in the present invention, the housing 10 may be configured by three or more housing portions. In addition, the housing 10 may not have a structure formed by laminating the housing portions, but may have a structure formed by butting front and back or left and right on the same layer.

However, the region of the housing forming the radio wave path $W_R$ through which the leakage electromagnetic wave propagates around the connector 31 needs to be conductive. Regarding the determination as to whether the housing is conductive, in the present specification, the housing in which the radio wave path $W_R$ through which the leakage electromagnetic wave propagates is formed is assumed to be conductive.

The above embodiment has been exemplified as the electronic control device 100 in which the connector 31 is exposed from the opening 13 provided in the housing 10, and the connector 31 and the external device are connected by the cable. However, the present invention can also be applied to an electronic control device that does not have the opening 13 through which the connector 31 is exposed, and accommodates the connector 31 connected to the circuit substrate 21, and an electronic device such as a sensor, a control circuit, a memory, or the like connected to the connector 31 in the housing 10.

Although various embodiments and modified examples have been described above, the present invention is not limited to the contents thereof. The embodiments may be combined or modified as appropriate. Other modes that can be considered within the scope of the technical idea of the present invention are also encompassed within the scope of the present invention.

The disclosed content of the following priority application is incorporated herein by reference.

Japanese Patent Application No. 2019-231755 (filed on Dec. 23, 2019)

REFERENCE SIGNS LIST 10 housing
13 opening
21 circuit substrate
22 signal wiring
23 ground wiring
31 connector
32a leading portion
32b rising portion
33 signal conductor
35 ground conductor
121 to 124, 221 to 2224, 321 to 324, 421 to 424, 521 to 524, 621 to 624, 721 to 724 conductor
126 end portion
131 gap
221a, 222a, 223a, upper half wall portion
100 electronic control device
$W_R$ radio wave path

The invention claimed is:

1. An electronic control device comprising:
a circuit substrate having a signal wiring and a ground wiring;
at least one connector having a signal conductor and a ground conductor respectively connected to the signal wiring and the ground wiring of the circuit substrate on one end side and extending on the other end side;
a housing including an accommodating portion that accommodates the circuit substrate and the at least one connector, in which a radio wave path through which a leakage electromagnetic wave propagates from one end on the circuit substrate side toward the other end on the side opposite to the circuit substrate side of the at least one connector is formed in an internal space at the periphery of the at least one connector; and
a leakage electromagnetic wave attenuating structure provided between the housing and the at least one connector,
wherein
the leakage electromagnetic wave attenuating structure includes a plurality of conductors that are arrayed along a direction in which the leakage electromagnetic wave propagates from the one end of the at least one connector, and attenuate the leakage electromagnetic wave propagating through the radio wave path.

2. The electronic control device according to claim 1, wherein the plurality of conductors are integrated with the housing.

3. The electronic control device according to claim 1, wherein the housing has an opening through which the radio wave path communicates with an outside of the housing, and the other end of the at least one connector protrudes from the opening to the outside of the housing.

4. The electronic control device according to claim 1, wherein a continuous gap is provided over the entire length of the radio wave path between at least one side surface of the connector and an end face on the connector side of the plurality of conductors.

5. The electronic control device according to claim 1, wherein
the at least one connector is mounted on the circuit substrate,
the at least one connector includes a lower surface on the circuit substrate side, an upper surface on a side opposite to the lower surface, and a pair of side surfaces provided between the lower surface and the upper surface, and
the plurality of conductors are provided to extend from an inner surface side of the housing toward the upper surface side or at least one side of the pair of side surfaces of the at least one connector.

6. The electronic control device according to claim 5, wherein each of the plurality of conductors extends from an inner surface side of the housing toward the upper surface side of the connector, and an end face of each of the plurality of conductors is separated from the upper surface of the connector except for the conductor at a final end of the radio wave path.

7. The electronic control device according to claim 5, wherein each of the plurality of conductors extends from an inner surface side of the housing toward the at least one side of the pair of side surfaces of the connector, and an end face of each of the plurality of conductors is separated from the at least one of the pair of side surfaces of the connector except for the conductor at a final end of the radio wave path.

8. The electronic control device according to claim 7, wherein the plurality of conductors include a first conductor provided between an inner surface of the housing and one of the pair of side surfaces of the at least one connector, and a second conductor provided between the inner surface of the housing and the other of the pair of side surfaces of the at least one connector.

9. The electronic control device according to claim 8, wherein the first conductor is provided to face an upper surface side of the connector and includes a region facing a part of an entire length in a direction orthogonal to a direction in which the radio wave path of the connector propagates, and the second conductor is provided to face an upper surface side of the connector and includes a region facing another part of an entire length in a direction orthogonal to the direction in which the radio wave path of the connector propagates.

10. The electronic control device according to claim 5, wherein the plurality of conductors have the same shape.

11. The electronic control device according to claim 5, wherein the at least one connector includes a plurality of connectors.

12. The electronic control device according to claim 11, wherein
the plurality of connectors are arrayed with each of the pair of side surfaces separated from each other, and
the conductor has a region provided between an inner surface of the housing and each of a pair of side surfaces of the connector arranged at one end portion in the arraying direction, and does not have a region interposed between the plurality of connectors.

13. The electronic control device according to claim 1, wherein the leakage electromagnetic wave attenuating structure is provided between the circuit substrate and the housing.

14. The electronic control device according to claim 1, wherein the at least one connector includes a rising portion extending in a direction substantially orthogonal to the circuit substrate from the one end, and the leakage electromagnetic wave attenuating structure is provided between the rising portion and the housing.

\* \* \* \* \*